United States Patent [19]
Gedney et al.

[11] 4,072,816
[45] Feb. 7, 1978

[54] INTEGRATED CIRCUIT PACKAGE
[75] Inventors: Ronald Walker Gedney; John Rasile, both of Endicott, N.Y.
[73] Assignee: International Business Machines Corporation, Armonk, N.Y.
[21] Appl. No.: 750,056
[22] Filed: Dec. 13, 1976
[51] Int. Cl.² ............................................. H05K 7/02
[52] U.S. Cl. ................................ 174/52 FP; 29/626; 339/17 CF; 361/406
[58] Field of Search ........................ 174/52 FP, 68.5; 29/626; 339/17 C, 17 CF; 361/404, 405, 406

[56] References Cited
U.S. PATENT DOCUMENTS

| 3,461,552 | 8/1969  | Wolf et al. | 174/52 FP X |
| 3,525,617 | 8/1970  | Bingham     | 174/68.5 X  |
| 3,626,081 | 12/1971 | Little      | 174/68.5    |
| 3,991,347 | 11/1976 | Hollyday    | 361/406 X   |

OTHER PUBLICATIONS
Sopher, "Fluxless Soldering", IBM Technical Disclosure Bulletin; vol. 8, No. 11, Apr. 1966, pp. 1543, 1544.

Primary Examiner—J. V. Truhe
Assistant Examiner—D. A. Tone
Attorney, Agent, or Firm—Paul M. Brannen

[57] ABSTRACT

A prepunched copper/dielectric laminate ground plane assembly is positioned on a metallized ceramic substrate having printed circuits on the surface thereof and provided with a plurality of circuit connection pins. Connection between the ground plane and the circuit connection pins is achieved by welding or soldering of bonding elements between selected pins, which also provides mechanical attachment of the ground plane to the substrate.

5 Claims, 4 Drawing Figures

INTEGRATED CIRCUIT PACKAGE

BACKGROUND OF THE INVENTION

1. Field of the Invention

This invention relates to integrated circuit packages and particularly to an improved circuit package utilizing metallized ceramic substrates, and still more particularly to an improved ground plane arrangement for use with the foregoing.

2. Description of the Prior Art

Prior art methods of forming ground planes for integrated circuit packages are directed to use of separate conducting and ground planes, formed by deposition, for example. U.S. Pat. No. 3,461,552 discloses a printed circuit card assembly designed for use with integrated circuit elements. A voltage plane is established on one side of the card, and a ground plane is established on the other side of the card. No separate ground plane structure is disclosed. U.S. Pat. No. 3,525,617 discloses an earth or ground plane on a ceramic substrate supporting circuit chips. The plane is formed in place by deposition on an insulating layer, rather than being formed as a separate laminated structure. U.S. Pat. No. 3,626,081 discloses a sandwich-type of voltage and ground plane, having conductive layers on opposite sides of a dielectric layer. It does not teach the provision of a laminated conductive layer on a dielectric layer, the composite laminate being held in mechanical position by bonding connections extending over the conductive layer.

SUMMARY OF THE INVENTION

The present invention contemplates a ground plane assembly formed of a laminate of conductive material, such as thin copper sheet, laminated to a thin layer of electrical insulating material. Clearance holes for connection pins on the substrate and for a circuit chip are provided in the ground plane. After positioning the laminate on the substrate, connections are established between the connection pins and the copper by soldering or otherwise electrically joining connection pins by bonding connections which are also joined to the copper. This structure serves to hold the ground plane in position mechanically as well as establishing electrical connections to the ground plane.

Accordingly, it is an object of the present invention to provide an improved ground plane structure for use with metallized ceramic substrates to provide an improved low cost high performance printed circuit module.

Another object of the invention is to provide an improved ground plane structure which utilizes bonding members to provide electrical connections as well as mechanical holding of the ground plane.

A further object of the invention is to provide an improved ground plane for use in a circuit module to provide a high degree of noise reduction.

The foregoing and other objects, features and advantages of the invention will be apparent from the following more particular description of a preferred embodiment of the invention, as illustrated in the accompanying drawings.

BRIEF DESCRIPTION OF DRAWINGS

Similar reference characters refer to similar parts in each of the several views.

DESCRIPTION OF THE PREFERRED EMBODIMENT

Figure 1:
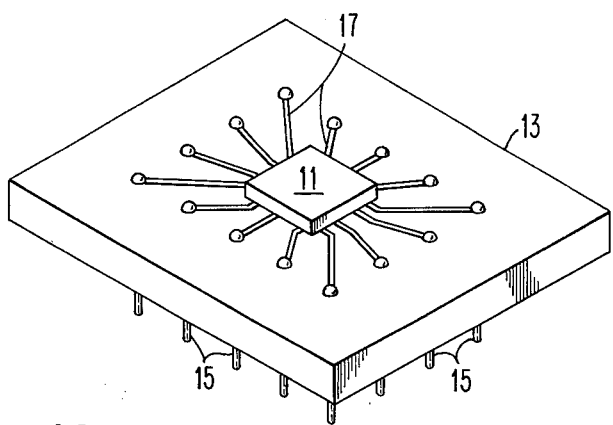
FIG. 1 is a diagrammatic view of an integrated circuit chip mounted on a ceramic substrate and connected to connection pins by printed circuits.

In FIG. 1, there is shown an integrated circuit chip 11 mounted on a ceramic substrate 13. A plurality of circuit connection pins 15 are mounted on and extend through the substrate. Metallized circuit lines 17 extend between the terminals on the chip 11 and the heads of the connection pins 15. Various known ways can be used to fabricate the structure so far described.

Figure 2:
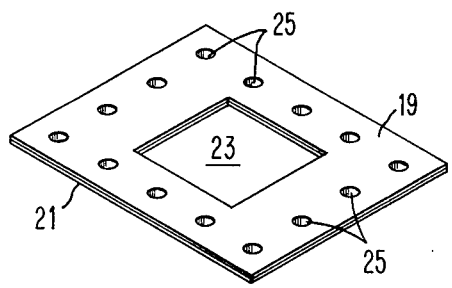
FIG. 2 shows a ground plane assembly in accordance with the invention, ready for mounting on the substrate.

FIG. 2 illustrates a laminated ground plane assembly configuration, in which a conductive layer or ground plane 19, of copper or other suitable material, is laminated with a dielectric or insulating layer 21. An opening 23 of suitable size and shape is provided for the chip 11. Also a plurality of openings 25 are provided at least equal in number and location of the heads of circuit connection pins 15. The holes or openings 25 are sufficiently large so that adequate clearance for the circuit connection pins is provided.

Figure 3:
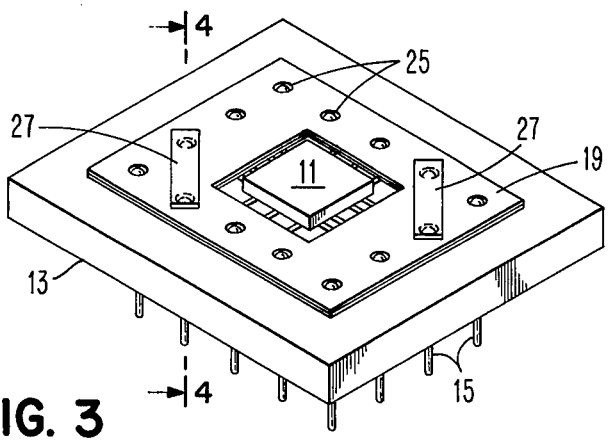
FIG. 3 shows the ground plane assembly in place and connected to ground connection pins by conductive jumpers or bonds.

The ground plane assembly of FIG. 2 is placed on the substrate carrying the chip, FIG. 1, the final assembly appearing as in FIG. 3. The dielectric side of the ground plane assembly is of course placed next to the substrate. An adhesive material may be coated on either the substrate or the dielectric to retain the ground plane in place prior to its bonding to certain of the pins.

One or more conductive jumpers or bonding elements 27 are positioned to contact the conductive layer of the ground plane assembly and the heads of one or more connection pins, and are thereafter soldered or welded to the plane and the pins. This feature not only establishes the required ground connection for the ground plane, but also serves to retain the ground plane mechanically in its proper location.

Figure 4:
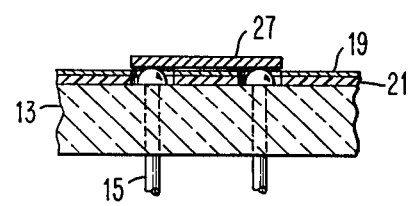
FIG. 4 is a cross-section of a portion of FIG. 3, taken along the line 4—4.

A cross-section view shown in FIG. 4 and taken along the line 4—4 in FIG. 3, shows the relationship of the bonding element 27, the circuit pins 15, and the conductive top layer 19 of the ground plane assembly.

A circuit package arranged in accordance with the invention provides a ground plane which is located in close proximity to the circuit chip 11 and the interconnections 17, which thereby provides a large reduction in the noise which would otherwise be present due to increased circuit density and speed of operation.

While the invention has been particularly shown and described with reference to a preferred embodiment thereof, it will be understood by those skilled in the art that various changes in form and details may be made therein without departing from the spirit and scope of the invention.

We claim:

1. A metallized ceramic package for high speed circuitry including
    a ceramic substrate,
    metallic circuit lines on said substrate,
    an integrated circuit chip positioned on said substrate and connected to said circuit lines, a plurality of connection pins passing through said ceramic substrate, each pin having a connection to one of said circuit lines, a ground plane of conducting material positioned on top of said substrate, said ground plane having holes therein over said connections and over said integrated circuit chip whereby said ground plane can be in close proximity to a substantial portion of said substrate, and a layer of insulating material between said ground plane and said circuit lines.

2. The combination as claimed in claim 1, further characterized by said ground plane and said layer of insulating material being a preformed and prepunched laminate.

3. The combination as claimed in claim 1, further including bonding elements for electrically connecting said ground plane to selected ones of said connector pins and also mechanically retaining said ground plane in position.

4. The combination as claimed in claim 3, further characterized by said bonding elements comprising solderable/weldable connections extending between at least two of said connection pins and fastened to the pin and to said conductive ground plane.

5. The method of providing an improved ground plane for a metallized ceramic package for high speed circuitry in which a ceramic substrate has metallized circuit lines thereon, and has an integrated circuit chip positioned on said substrate and connected to said circuit lines, and further has a plurality of connector pins passing through said ceramic substrates, each of said pins being a connection to one of said circuit lines, comprising the steps of:

laminating a sheet of conductive material and dielectric material to form a laminated ground plane assembly, punching said ground plane assembly to provide clearance openings for said chip and said pins, positioning said ground plane assembly and said substrate so as to clear said chip and said pins, and bonding said conductive material to at least one of said pins, at at least two different locations.

* * * * *